United States Patent
Charpin-Nicolle

(10) Patent No.: US 8,836,014 B2
(45) Date of Patent: Sep. 16, 2014

(54) DOUBLE-GATE ELECTRONIC MEMORY CELL AND METHOD OF MANUFACTURING SUCH A CELL

(71) Applicant: Christelle Charpin-Nicolle, Fontanil-Cornillon (FR)

(72) Inventor: Christelle Charpin-Nicolle, Fontanil-Cornillon (FR)

(73) Assignee: Commissariat a l'energie atomique et aux energies alternatives, Paris (FR)

( * ) Notice: Subject to any disclaimer, the term of this patent is extended or adjusted under 35 U.S.C. 154(b) by 0 days.

(21) Appl. No.: 13/852,504

(22) Filed: Mar. 28, 2013

(65) Prior Publication Data
US 2013/0256776 A1   Oct. 3, 2013

(30) Foreign Application Priority Data

Mar. 29, 2012   (FR) ..................................... 12 52842

(51) Int. Cl.
| | |
|---|---|
| H01L 21/70 | (2006.01) |
| H01L 29/78 | (2006.01) |
| H01L 29/76 | (2006.01) |
| H01L 21/02 | (2006.01) |
| H01L 29/788 | (2006.01) |
| H01L 29/423 | (2006.01) |
| H01L 21/28 | (2006.01) |
| G11C 16/04 | (2006.01) |
| H01L 29/66 | (2006.01) |
| H01L 27/115 | (2006.01) |

(52) U.S. Cl.
CPC .......... *H01L 29/788* (2013.01); *H01L 29/7881* (2013.01); *H01L 29/42344* (2013.01); *H01L 21/28273* (2013.01); *H01L 21/28282* (2013.01); *G11C 16/0425* (2013.01); *H01L 27/11568* (2013.01); *G11C 16/0466* (2013.01); *H01L 29/66833* (2013.01)
USPC ........................... 257/326; 438/258; 438/261

(58) Field of Classification Search
USPC ......... 257/288, 388, 387, 391, 392, 412, 413, 257/499
See application file for complete search history.

(56) References Cited

U.S. PATENT DOCUMENTS

| | | | |
|---|---|---|---|
| 5,768,192 | A | 6/1998 | Eitan |
| 7,042,045 | B2 * | 5/2006 | Kang et al. .................... 257/321 |
| 7,130,223 | B2 | 10/2006 | Ishimaru et al. |
| 2004/0207025 | A1 | 10/2004 | Chiba et al. |
| 2006/0028868 | A1 | 2/2006 | Okazaki et al. |
| 2009/0103355 | A1 | 4/2009 | Saitou |

OTHER PUBLICATIONS

Search Report and Written Opinion as issued for French Patent Application No. 1252842, dated Oct. 31, 2012.

(Continued)

*Primary Examiner* — Khiem D Nguyen
*Assistant Examiner* — Wilner Jean Baptiste
(74) *Attorney, Agent, or Firm* — Pillsbury Winthrop Shaw Pittman LLP

(57) ABSTRACT

An electronic memory cell includes a first selection transistor gate surmounting a first part of the channel and a lateral spacer disposed against a lateral flank of the selection transistor gate, a part of the lateral spacer forming a memory transistor gate surmounting a second part of the channel. The memory transistor gate includes a stack of the ONO type and a conductive zone including a lateral face inclined at an angle $\alpha$ strictly between 0 and 90° with respect to the plane of the substrate.

10 Claims, 8 Drawing Sheets

(56) References Cited

OTHER PUBLICATIONS

Masoero L. et al; "Scalability of split-gate charge trap memories down to 20nm for low-power embedded memories", Electron Device Meeting (IEDM), 2011 IEEE International, IEEE, Dec. 5, 2011, pp. 9.5,1-9.5.4.

Kianian et al.; "A novel 3 volts-only, small sector erase, high density flash $E^2PROM$"; Technical Digest of VLSI Technology, 1994, p. 71-72.

* cited by examiner

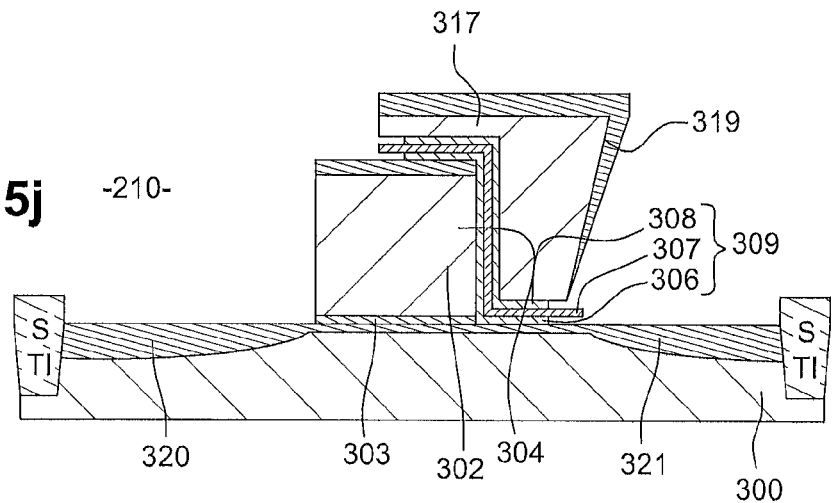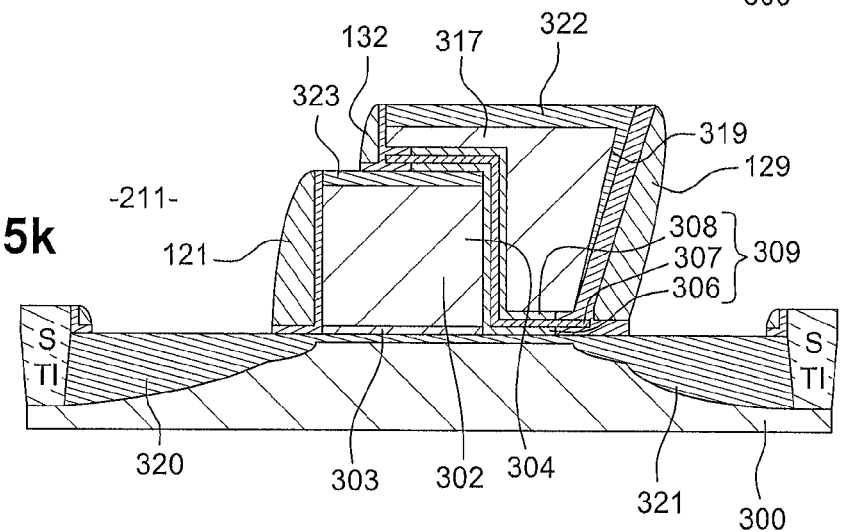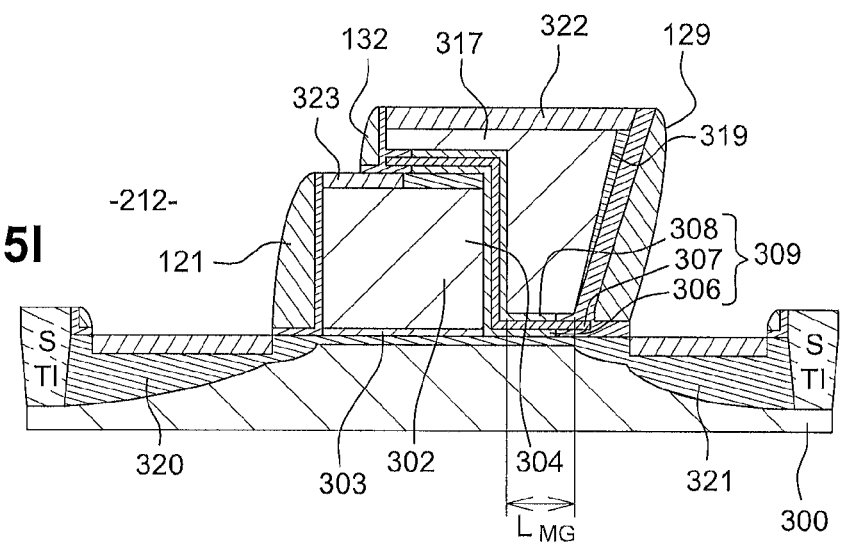

DOUBLE-GATE ELECTRONIC MEMORY CELL AND METHOD OF MANUFACTURING SUCH A CELL

CROSS REFERENCE TO RELATED APPLICATIONS

This application claims the benefit of priority from French Patent Application No. 1252842 filed on Mar. 29, 2012, the entire content of which is incorporated herein by reference.

FIELD

The invention relates to the area of double-gate non-volatile electronic memory cells, and more particularly the area of double-gate Flash memories (floating gate memory and selection gate) which find particularly interesting application in the area of embedded electronics.

BACKGROUND

There are numerous types of non-volatile memories, i.e. memories retaining information stored in the absence of electrical supply, able to be written and/or erased electrically:

EPROMs (<<Erasable Programmable Read Only Memories>>), the contents whereof can be written electrically, but which have to be subjected to UV radiation in order to erase the stored information;

EEPROMs (<<Electrically Erasable Programmable ROMs>>), the contents whereof can be written and erased electrically, but which require for their production larger semiconductor surfaces than memories of the EPROM type, and which are therefore more costly to produce.

There are also non-volatile memories, called Flash memories, which do not have the drawbacks of the aforementioned EPROM or EEPROM memories. A Flash memory is formed by a plurality of memory cells capable of being electrically programmed individually, a large number of cells, called a block, sector or page, capable of being erased simultaneously and electrically. Flash memories combine both the advantage of EPROM memories in terms of integration density and the advantage of EEPROM memories in terms of the electrical erasure.

Moreover, the durability and the reliable electrical consumption of Flash memories make them advantageous for numerous applications: digital cameras, cell phones, printers, personal organisers, laptop computers, or portable reader and sound recording devices, USB sticks, etc. Moreover, Flash memories do not have mechanical elements, which endow them with a fairly considerable resistance to impacts.

The majority of Flash memories are of the <<stand-alone>> type and have large storage capacities, generally greater than 1 Gb, and are dedicated to mass storage applications.

However, there are also so-called embedded Flash memories (<<embedded memories>>), the production of which is integrated into a CMOS type process and which are becoming of increasing interest, for example in the areas of the car and microcontrollers, for the storage of data or codes. These embedded Flash memories are produced on a chip which also comprises CMOS devices intended to perform logic functions other than the storage of data. These embedded Flash memories are generally produced for smaller storage capacities than those of <<stand-alone>> type memories, their capacities being able to vary generally from several bits to several Mb. The features of the embedded Flash memories referred to are a low production cost, excellent reliability (especially at high temperature), reliable electrical consumption, or high programming speed, these features being a function of the application for which they are intended.

The majority of Flash memories comprise a MOS transistor type structure (gate, source, drain and channel) comprising an electrical charge storage site, called a floating gate, formed for example by a polysilicon layer disposed between two oxide layers, and disposed between the electrically conductive gate material and the transistor channel. Storage is performed by applying to the conductive material a voltage higher than the threshold voltage, for example between 15 V and 20 V, which permits information to be stored in the form of charges trapped in the floating gate.

However, such memories have drawbacks limiting a reduction in their dimensions. A reduction in the thickness of the tunnel oxide (oxide disposed between the channel and the polysilicon layer) leads to an increase in the SILC (<<Stress Induced Leakage Current>>). The prolonged use of such a memory (repetition of write—erase cycles) generates defects in the tunnel oxide, which assist the conduction of charges and adversely affect the retention of charges in the floating gate, which causes problems in the case of a large SILC. In practice, it is therefore difficult to reduce the thickness of the tunnel oxide of these memories to less than 8 nm without the SILC becoming a critical phenomenon for storage. Moreover, by reducing the dimensions of such a memory cell, the parasitic coupling between the floating gates of two adjacent cells of one and the same memory becomes considerable and can therefore adversely affect the reliability of the memory.

For these reasons, memories of the MONOS type (Metal Oxide Nitride Oxide Silicon), also referred to as NROM memories, have been proposed to replace polysilicon floating gate memories. Document U.S. Pat. No. 5,768,192 describes such memories, in which the electrical charges are stored in traps formed in a floating gate composed of nitride and disposed between two oxide layers. In such a nitride layer, the traps are insulated from one another. Thus, an electron stored in one of the traps remains physically located in this trap, which makes these memories much more <<resistant>> to defects in the tunnel oxide, and therefore less affected by an increase in the SILC. In the presence of a defect in the tunnel oxide, the storage layer, i.e. the nitride layer, loses only the electrons located in the close vicinity of the defect, the other trapped electrons not being affected by this defect. These memories therefore have a better reliability. It is thus possible to have a tunnel oxide of thickness less than approx. 8 nm, and therefore to reduce the required programming voltages. Moreover, on account of the small thickness of nitride to form the storage layer, the coupling between two adjacent memory cells is greatly reduced compared with polysilicon floating gate cells. Finally, the structure of an NROM type memory is also suitable for producing embedded memories on account of the simplicity of the process of integration of these memories.

The document by S. Kianian et al., <<A novel 3 volts-only, small sector erase, high density flash $E^2PROM$>> (Technical Digest of VLSI Technology, 1994, p. 71) describes another type of memory, called a <<split-gate>> memory, which comprises inside one and the same memory cell a memory transistor and a selection transistor (or control transistor) formed on a single active zone. Such a double-gate memory cell is generally programmed by the injection of carriers via the source (<<source side injection>> in English), a mechanism which precisely requires the presence of a selection transistor alongside the memory transistor, and which permits the programming speed to be increased, while at the same time reducing the consumption compared to the NROM type memory.

In order to benefit from the advantages of each structure, split-gate and NROM, document US2004/207025A1 proposes another type of double-gate memory combining the structure of an NROM type memory with a split-gate architecture. One of the difficulties in producing these memories relates to the control of the position of the gates (control transistor gate and memory transistor gate) with respect to one another.

These gates are produced by two successive photolithographies, the misalignment of the second gate with respect to the first gate fixing the length of the second gate. Poor control of the relative positions of the two gates is thus reflected in poor control of the electrical characteristics of the second transistor, and therefore potentially poor performance of the memory. Consequently, a very precise control of the position of the gates is necessary during the production of this type of memory.

In order to overcome this alignment constraint, document U.S. Pat. No. 7,130,223B2 proposes to produce a double-gate memory combining a structure of an NROM type memory with a split-gate architecture and wherein the memory transistor gate, i.e. the gate comprising the data storage layer, is produced in the form of a lateral spacer of the control transistor gate, disposed against one of the two lateral flanks of the control transistor gate. Such a structure makes it possible to control precisely the position and the size of the memory transistor gate compared with the control transistor gate because, on account of the fact that the memory transistor gate is produced in the form of a lateral spacer, the latter is therefore self-aligned with respect to the control transistor gate.

Such a structure is illustrated by FIG. 1 which represents diagrammatically a double-gate memory 1 combining the structure of an NROM type memory with a split-gate architecture, wherein the memory transistor gate is produced in the form of a lateral spacer of the control transistor gate. Memory 1 comprises an active channel zone 2 produced in a semiconductor material and comprising a channel 3 disposed between a drain extension region 4 and a source extension region 5. Memory 1 further comprises a selection transistor gate 6 surmounting a first part $3_1$ of channel 3 and a lateral spacer 7 disposed against the lateral flank of selection transistor gate 6.

This lateral spacer 7 forms the gate of memory transistor 9 surmounting second part $3_2$ of channel 3. This memory transistor 9 comprises in particular:
  an oxide-nitride-oxide dielectric tri-layer stack (so-called ONO stack) 10, the nitride layer being used to store the electrical charges;
  a conductive zone 11 of the polysilicon memory transistor gate having an essentially rounded lateral face 15;
  thin spacer layers located on the rounded part of conductive zone 11, for example of high thermal oxide HTO (layer 13) and of nitride $Si_3N_4$ (layer 12). These thin spacer layers are again found on the opposite part of the selection transistor.

Lateral spacer 7 makes it possible to insulate selection transistor gate 6 from the drain zones, but also to form memory transistor gate 9 via ONO stack 10.

However, with such a structure, it is very difficult then to produce electrical contacting on memory transistor gate 9, bearing in mind the small dimensions of this gate in the form of a lateral spacer. This contacting is for example illustrated by silicidation zone 14 located at the top of rounded lateral flank 15. It will be noted that the zone permitting the silicidation is relatively small. This difficulty is made worse by the fact that the flanks obtained by the standard processes tend to be of a triangular shape; it is in fact very difficult to obtain, by direct etching, a rounded shape permitting a sufficient silicidation surface to be obtained. One such architecture 16 is illustrated in FIG. 2. Memory 16 is identical to memory 1, but has a conductive zone 17 of triangular shape, on which silicidation zone 18 has an even more limited zone than in the case of FIG. 1.

Moreover, the article <<Scalability of split-gate charge memories down to 20 nm for low-power embedded memories>> (Masoero et al.—Electron Devices Meeting (IEDM)—2011) has demonstrated that the reduction in the length of memory gate $L_{MG}$ (i.e. the length of conductive zone 17 of the memory transistor gate closest to channel 3 and measured along the length of channel 3—see FIG. 1) makes it possible to improve the electrical performance of the memory, such as the programming window or the consumed energy. It can easily be seen that such a reduction in the length of the gate makes the creation of a large contact zone on the gate of the memory transistor even more difficult.

SUMMARY

As aspect of the invention relates to an electronic memory cell of the NROM type with a split-gate architecture making it possible to obtain a satisfactory contacting surface (i.e. silicidation zone) while at the same time improving the electrical performance of said memory cell.

To do this, there is provided in an aspect of the invention an electronic memory comprising:
  a substrate on which there is formed an active channel zone produced in a semiconductor material and comprising a channel disposed between a drain extension region and a source extension region;
  a first gate structure, the so-called selection transistor gate, surmounting a first part of said channel;
  a lateral spacer disposed against at least one lateral flank of said selection transistor gate, said lateral spacer comprising a second gate structure, the so-called memory transistor gate, surmounting a second part of said channel, said transistor memory gate comprising:
    a stack of layers, whereof one of said layers is suitable for storing electrical charges, said stack including a first stack zone in contact with said second part of said channel and a second stack zone in contact with said lateral flank of said selection transistor gate;
    a conductive zone of the memory transistor gate including
      a first lateral face in contact with said second stack zone in such a way that the latter separates said lateral flank of the selection transistor gate and said first lateral face;
      a lower face essentially plane and parallel to the plane of the substrate, said lower face being in contact with said first stack zone in such a way that said first stack zone separates said second part of said channel and said the lower face;
      an upper face essentially plane and parallel to the plane of the substrate;
      a second lateral face, said first and second lateral faces connecting said lower face to said upper face, said second lateral face being inclined at an angle α strictly between 0 and 90° with respect to the plane of the substrate, in such a way that the length of said upper face is strictly greater than the length of said lower face, said lengths being measured as the distance between said first and second lateral faces over the length of said channel.

Use is beneficially made of a second slanting lateral face having an inclination strictly between 0 and 90° with respect to the plane of the substrate, in such a way that the distance between the first lateral face and the second lateral face continuously increases from the zone closest to the channel towards the upper zone suitable for producing the silicidation. It is thus possible to obtain a small length of the memory gate permitting the electrical performance of the cell to be improved (in particular by increasing the programming window and minimising the consumed energy) while at the same time obtaining a large and plane silicidation surface on the upper part of the conductive zone of the memory transistor gate.

The memory cell according to an embodiment of the invention can also have one or more of the following features, taken individually or according to any technically possible combinations:
- angle α is beneficially greater than or equal to 45° in such a way that the deposition of the electrical layers can be carried out more easily, for example in HTO (<<High Thermal Oxide>>) and $Si_3N_4$;
- angle α is between 45° and 70°, for example 60°;
- the layer suitable for storing electrical charges of said stack is disposed between two layers of electrical material of said stack;
- said layer suitable for storing electrical charges is for example a nitride layer or a layer comprising silicon nano-crystals.

An aspect of the present invention also relates to a method of manufacturing a memory cell, wherein the creation of the conductive zone of the memory transistor gate, having a lateral face inclined at an angle α strictly between 0 and 90° with respect to the plane of the substrate, comprises:
- deposition of a sacrificial material layer;
- creation on said sacrificial material layer of a resin pattern comprising at least one inclined flank having an obtuse angle of inclination β with respect to the plane of the substrate;
- transfer of the shape of said resin pattern into the sacrificial material layer by etching of the sacrificial material and the resin in such a way that a pattern is obtained in the sacrificial material comprising at least one inclined flank having an obtuse angle of inclination β' with respect to the plane of the substrate essentially equal to (180°-α) where α is the desired acute angle of inclination of the second lateral face with respect to the plane of the substrate;
- conformal deposition of a conductive material filling the spaces located on each side of the pattern in the sacrificial material, in such a way that the conductive material assumes the shape of the inclined flank;
- stripping of a part of the conductive material and of the totality of the sacrificial material so as to retain the conductive zone of the memory transistor gate produced in said conductive material and having a lateral face inclined at an angle α strictly between 0 and 90° with respect to the plane of the substrate, said lateral face corresponding, before stripping of the sacrificial material, to the contact face with the inclined flank of the pattern in the sacrificial material.

The method of manufacture according to an embodiment of the invention can also comprise one or more of the following features, taken individually or according to any technically possible combinations:

- the creation on said sacrificial material layer of a resin pattern comprising at least one inclined flank having an obtuse angle of inclination β is achieved by a step of lithography and creep of a resin layer;
- the method comprises, prior to the deposition of a sacrificial material layer:
  formation of the selection transistor;
  deposition of the stack of layers, one of said layers being suitable for storing electrical charges, the deposition of the sacrificial layer being carried out above the layers of the stack;
- the thickness of the sacrificial material layer is, in the zone in which the conductive zone of the memory transistor gate is created, greater than or equal to the cumulative thickness of the selection transistor gate and the layers of the stack;
- the etching rates of the resin and the sacrificial material are essentially identical during the transfer of the shape of said resin pattern into the sacrificial material layer by etching of the sacrificial material and the resin. For example, with a machining angle of 40° with respect to axis y of the wafer to be machined, the etching rate of the resin is approximately 13 nm/min and the etching rate of the $Si_3N_4$ is of the order of nm/min.

BRIEF DESCRIPTION OF THE DRAWINGS

Other features and benefits of the invention will emerge from a reading of the following description, making reference to the appended figures:

FIGS. 5a to 5l illustrate the different steps in an example of a method of manufacturing the memory cell of FIG. 4.

DETAILED DESCRIPTION

For greater clarity, identical or similar elements are referred to by the same reference symbols in all the figures.

Figure 3:
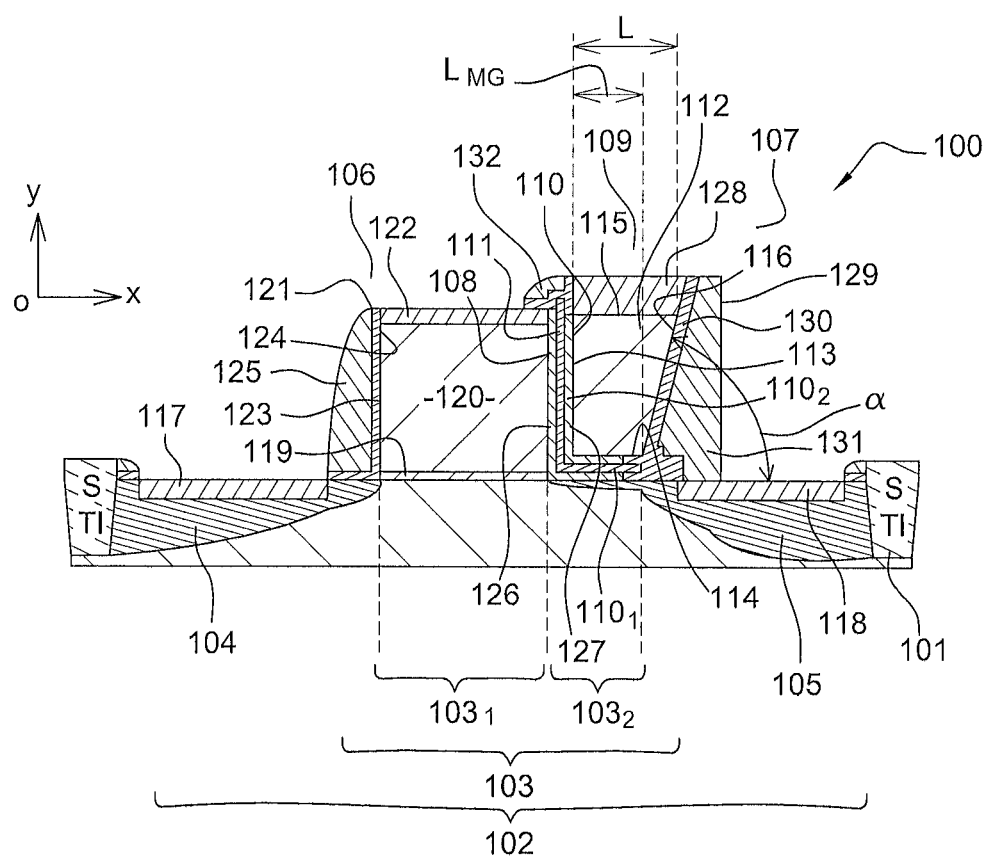
FIG. 3 represents an electronic memory cell of the NROM type with a split-gate architecture according to an embodiment of the invention.

FIG. 3 represents an example of embodiment of an electronic memory cell 100 of the NROM type with a split-gate architecture according to the invention.

Cell 100 comprises a substrate 101 on which there is formed an active channel zone 102 produced in a semiconductor material and comprising a channel 103 disposed between a drain extension region 104 and a source extension region 105. In the case of the embodiment of a transistor of type n on a substrate 101 of type p, drain extension region 104 and source extension region 105 are doped n+. Each drain extension region 104 and source extension region 105 also comprises a silicidation, respectively 117 and 118, on its upper surface. Substrate 101 is a substrate based on a semiconductor such as silicon. The length of the channel is represented here along an axis Ox parallel to the plane of the substrate, axis Oy being perpendicular to the plane of the substrate.

According to the principle of NROM type memories with a split-gate architecture, memory 100 comprises two gate structures disposed one beside the other:
- a first gate structure, the so-called selection transistor gate (or control transistor gate) 106;
- a second gate structure, the so-called memory transistor gate (or storage transistor gate) 109 produced in the form of a lateral spacer 107 of selection transistor gate 106.

Channel 103 is essentially separated into two parts $103_1$ and $103_2$ side by side.

Selection transistor gate 106 surmounts first part $103_1$ while memory transistor gate 109 surmounts second part $103_2$.

Selection transistor gate 106 comprises:
- a gate dielectric layer 119 (for example of $SiO_2$) in contact with first part $103_1$ (the thickness of this dielectric layer, measured along axis Oy, depends on the technological core of memory cell 100 and is for example between 1 nm and 10 nm);
- a conductive zone of selection transistor gate 120 (for example of doped polysilicon n+) covered by a silicidation layer 122; the thickness of this conductive zone 120 is for example equal to 50 nm;

Selection transistor gate 106 is insulated from contact 118 of source 105 by a first lateral spacer 107 and from contact 117 of the drain by a second lateral spacer 121.

More precisely, the conductive zone of selection transistor gate 120 has two lateral walls 123 and 108 and each lateral wall 123 and 108 is entirely covered respectively by spacers 121 and 107.

Second lateral spacer 121 is an insulating spacer extending over the entire lateral flank (drain side) and formed by a dielectric material, which can for example be a nitride or an oxide/nitride bi-layer (for example a layer 124 of $SiO_2$ HTO and a layer 125 of $Si_3N_4$).

First lateral spacer 107 is different from second spacer 121, inasmuch as a part of this first spacer 107 forms memory transistor gate 109.

First spacer 107 comprises an oxide-nitride-oxide (so-called ONO) tri-layer stack 110 formed by a first dielectric layer 126 (for example of $SiO_2$), a second layer 111 produced in a material capable of storing electrical charges (for example composed of $Si_3N_4$) and a third layer 127 composed of a dielectric material (for example of $SiO_2$); first layer 126 has for example a thickness between 3 and 8 nm; second layer 111 has for example a thickness between 4 et 10 nm and a third layer 127 has for example a thickness between 4 and 15 nm.

ONO stack 110 comprises two zones:
- a first essentially horizontal stack zone $110_1$ (i.e. with a surface parallel to the plane of substrate 101) in contact with second part $103_2$;
- a second essentially vertical stack zone $110_2$ (i.e. with a surface perpendicular to the plane of substrate 101).

Memory transistor gate 109 includes said ONO stack 110 as well as a conductive zone of memory transistor gate 112 (for example of doped polysilicon n+).

Conductive zone 112 of the memory transistor gate comprises:
- a first lateral face 113 in contact with second stack zone $110_2$ in such a way that the latter separates lateral flank 108 of selection transistor gate 106 and first lateral face 113;
- a lower face 114 essentially plane and parallel to the plane of substrate 101; this lower face 114 is in contact with first stack zone $110_1$ in such a way that the latter is interposed between second part $103_2$ of channel 103 and lower face 114 of conductive zone 112;
- an upper face 115 essentially plane and parallel to the plane of substrate 101;
- a second lateral face 116 inclined at an angle α strictly between 0 and 90° with respect to the plane of substrate 101; in an embodiment, angle α is preferably greater than or equal to 45°, preferably essentially equal to 60°.

First and second lateral faces 113 and 116 connect lower face 114 to upper face 115. Since second lateral face 116 forms an inclined slant at an acute angle α strictly between 0 and 90° with respect to the plane of substrate 101, the distance between first and second lateral faces 113 and 116 will gradually diminish from upper face 115 up to lower face 114.

Thus, length L of upper face 115 is strictly greater than length $L_{MG}$ of lower face 114, said lengths L and $L_{MG}$ being measured as the distance between the first lateral face 113 and second lateral face 116. This distance is measured along the direction of the length of channel 103, i.e. along axis Ox.

To a first approximation, it is possible to consider that $L=L_{MG}+h/tg\alpha$ where h denotes the height of the memory transistor.

In the following case, we shall take two examples, with respectively angles α equal to 60° and 45°.

1/ Case where α=60°

In the case where $L_{MG}$=20 nm and h=50 nm, we obtain L=20+h//√3, i.e. approx. 50 nm.

In the case where $L_{MG}$=200 nm and h=50 nm, we obtain L=200+h/√3 i.e. approx. 230 nm.

In the case where $L_{MG}$=200 nm and h=100 nm, we obtain L=200+h/√3 i.e. approx. 260 nm.

In the case where $L_{MG}$=500 nm and h=100 nm, we obtain L=500+h/√3 i.e. approx. 560 nm.

2/ Case where α=45°

In the case where $L_{MG}$=20 nm and h=50 nm, we obtain L=20+50 i.e. 70 nm.

In the case where $L_{MG}$=200 nm and h=50 nm, we obtain L=200+50 i.e. 250 nm.

In the case where $L_{MG}$=200 nm and h=100 nm, we obtain L=200+100 i.e. 300 nm.

In the case where $L_{MG}$=500 nm and h=100 nm, we obtain L=500+100 i.e. 600 nm.

Figure 1:
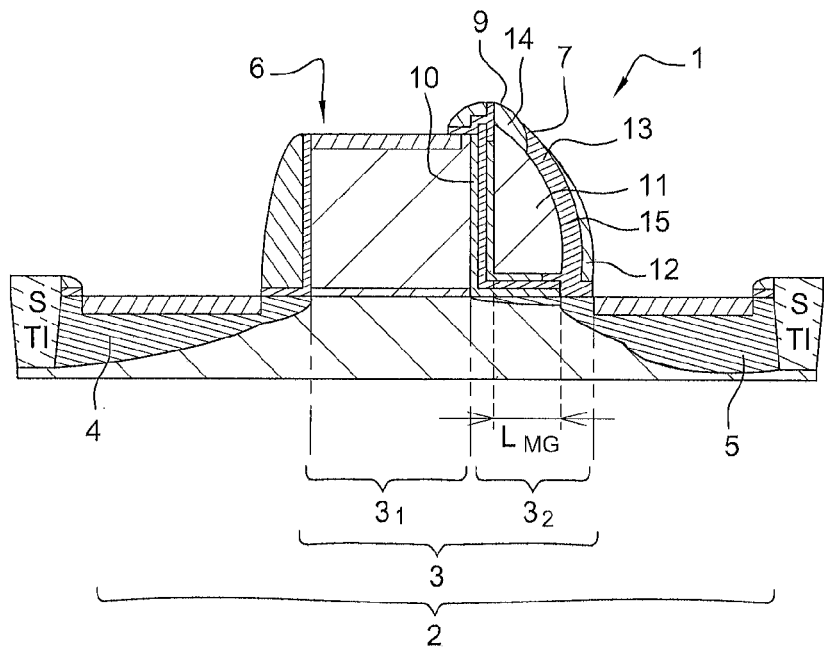
FIG. 1 represents diagrammatically a first example of a double-gate memory according to the prior art combining the structure of an NROM type memory with a split-gate architecture.
Figure 2:
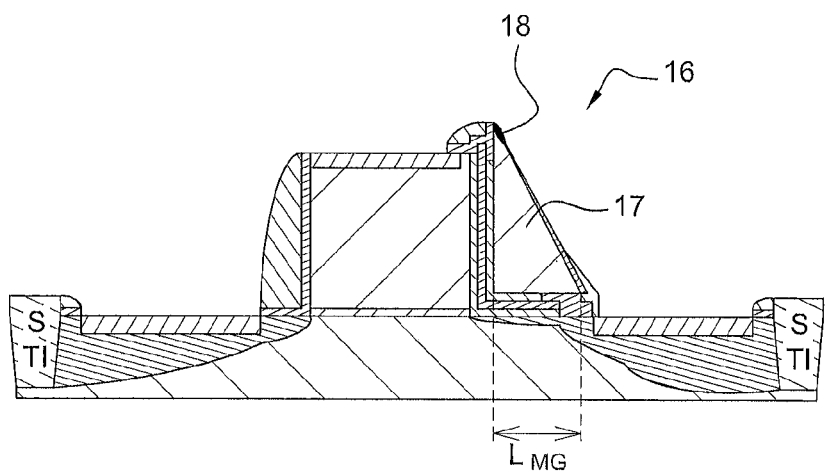
FIG. 2 represents diagrammatically a second example of a double-gate memory according to the prior art combining the structure of an NROM type memory with a split-gate architecture.

In an embodiment, angle α will be selected small in order to have both a large length L and a small length of memory gate $L_{MG}$ (for example α=45°). According to the aforementioned article <<Scalability of split-gate charge memories down to 20 nm for low-power embedded memories>> (Masoero et al.—Electron Devices Meeting (IEDM)—2011), the reduction in the length of memory gate $L_{MG}$ (i.e. the length of conductive zone 17 of the memory transistor gate closest to channel 3 and measured along the length of channel 3—see FIG. 1) makes it possible to improve the electrical performance of the memory, such as the programming window or the consumed energy. We therefore seek the shortest possible length of memory gate $L_{MG}$. Thus, according to an embodiment, α=45° and $L_{MG}$ between 20 nm and 80 nm will be adopted.

A contact layer 128 is also produced on upper face 115 by silicidation.

Length $L_{MG}$ corresponds to the length of the memory gate, i.e. the length of the memory gate zone closest to second part $103_2$ of channel 103.

As mentioned previously, the electrical performance of cell 100 is improved when the length of the memory transistor gate is reduced. Cell 100 according to an embodiment of the invention thus makes it possible to reduce the length of the memory gate $L_{MG}$ while at the same time having a greater length L on upper face 115 of conductive zone 112 in such a way that the surface for producing the contact is larger.

The bevelled shape of conductive zone 112 of the memory transistor gate (via second inclined lateral face 116) thus makes it possible to have a large silicidation surface 115 and to have optimum contacting whilst at the same time minimising the length of memory gate $L_{MG}$.

Second inclined lateral face 116 is also covered by an insulating spacer 129 extending over the entire lateral flank (source side) and formed by a dielectric material, which can for example be a nitride or an oxide/nitride bi-layer (for example, a layer 130 of $SiO_2$ HTO and a layer 131 of $Si_3N_4$). This insulating spacer 129 makes it possible to insulate memory transistor gate 107 from source 105.

Moreover, its function is also to <<space apart>> the doped zones (source and drain), which become widened during the post-baking and could thus become joined and cause a short-circuit.

It will also be noted that the lateral flank of upper surface 115 (covered by silicidation 128) is also covered by an insulating spacer 132 extending over the entire lateral flank (on the selection transistor gate 106 side) and formed by a dielectric material, which can be of the same kind is previously, can be a nitride or an oxide/nitride bi-layer. This insulating spacer 132 makes it possible to insulate silicidation surfaces 128 and 122 belonging respectively to memory transistor gate 107 and to selection transistor gate 106.

This insulating spacer 132 is not absolutely indispensable, because the stack of layers 110 already insulates selection transistor gate 106 and memory transistor gate 107. This latter configuration can be produced for example if the height of memory transistor gate 107 is approximately at the same level as the height of selection transistor gate 106. However, insulating spacer 132 contributes towards reinforcing the insulation between two gates.

Figure 4:
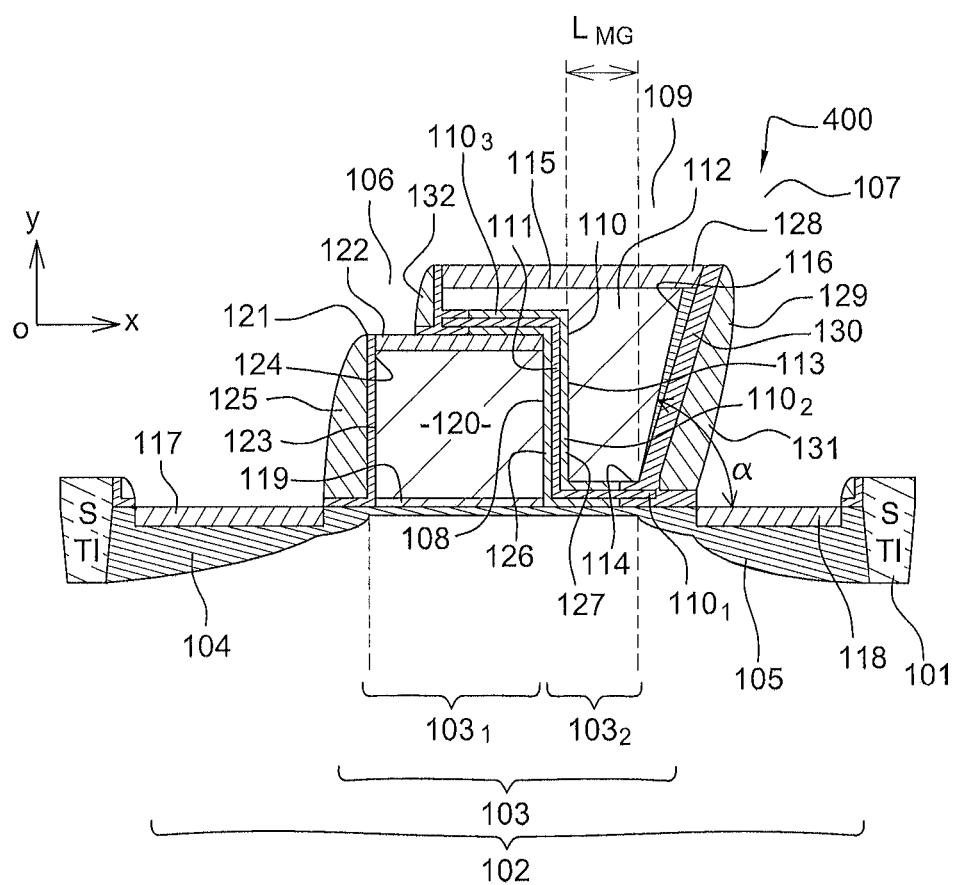
FIG. 4 represents a variant of the electronic memory cell of the NROM type of FIG. 3.

FIG. 4 represents a variant 400 of the NROM type electronic memory cell with a split-gate architecture of FIG. 3. Cells 100 and 400 comprise the same features (illustrated with the same references in FIG. 4).

Cell 400 differs from cell 100 in that ONO stack 110 has a third upper stack zone $110_3$ parallel to first stack zone $110_1$ (i.e. with a surface parallel to the plane of substrate 101). This third zone $110_3$ stops essentially at mid-length of silicidation surface 122 of selection transistor gate 106. In the case of cell 400, conductive zone 112 (as well as silicidation surface 128) extends over the upper face of third stack zone $110_3$ in such a way that a still greater silicidation surface is obtained.

FIGS. 5a to 5l illustrate the different steps of an example of the method of manufacturing the memory cell of FIG. 4.

Figure 5A:
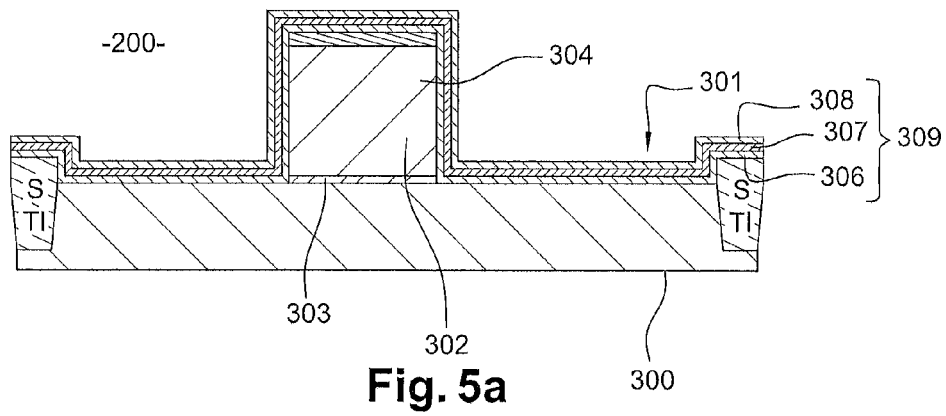

According to first step 200 illustrated in FIG. 5a, there is first produced in a cavity 301 formed in substrate 300 a selection transistor gate 302 comprising of a gate dielectric layer 303 (produced for example by thermal oxidation of the semiconductor zone) followed by a polysilicon conductive layer 304.

Next to be carried out is the deposition of an oxide-nitride-oxide (so-called ONO) tri-layer stack 309 formed by a first dielectric layer 306 (for example of $SiO_2$), a second layer 307 produced in a material capable of storing electrical charges (for example composed of $Si_3N_4$) and a third layer 308 composed of a dielectric material (for example of $SiO_2$). This deposition can be carried out by conformal deposition in such a way as to cover gate 302.

Figure 5B:
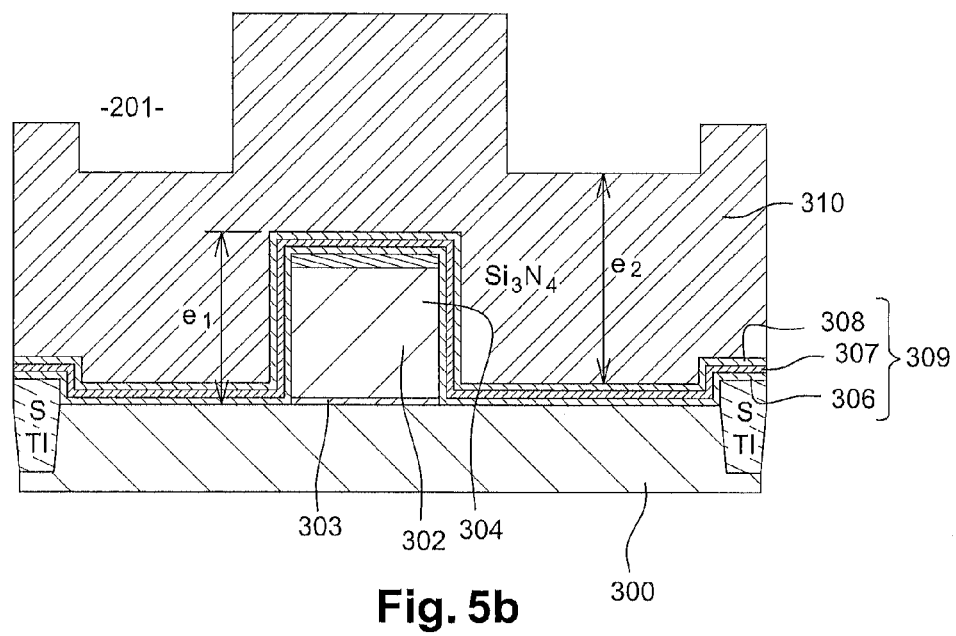
Figure 5C:
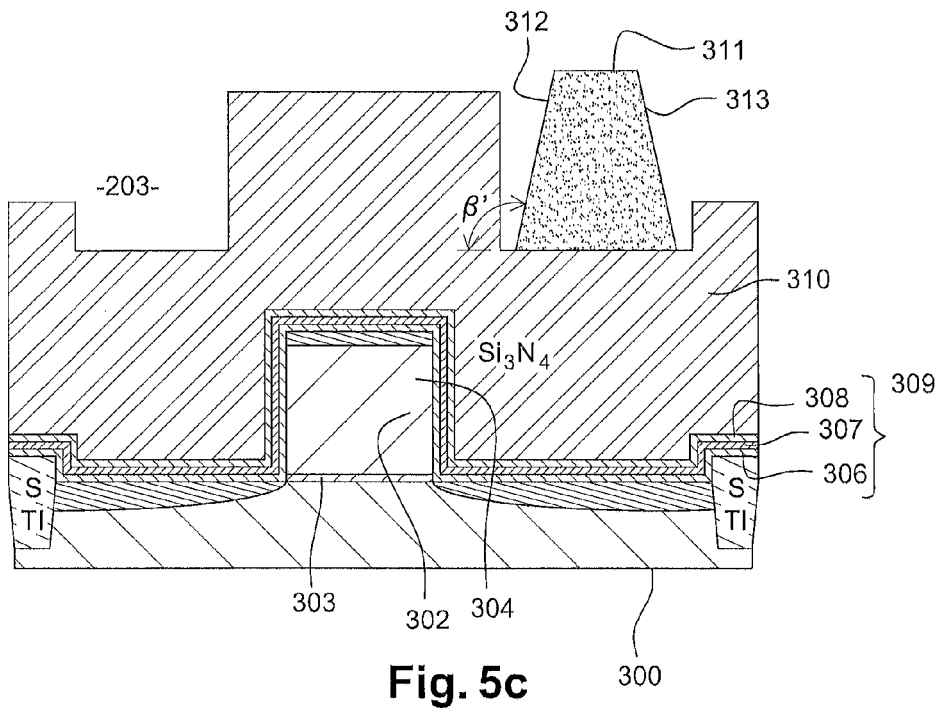

According to a second step 201 illustrated in FIG. 5b, a layer 310 of sacrificial material, for example of $Si_3N_4$, is deposited. A condition for obtaining inclined second lateral face 116 such as represented in FIGS. 3 and 4 is to deposit, at least in the zone in which this inclined second lateral face 116 is produced, the sacrificial material over a thickness e2 greater than or equal to cumulative thickness e1 of gate dielectric layer 303, polysilicon conductive layer 304 and ONO tri-layer stack 309. This thickness e2 is for example greater than or equal to 80 nm. According to a third step 203 illustrated in FIG. 5c, a resin creep pattern 311 is created in the zone in which inclined second lateral face 116 is produced. This resin pattern 311 has an essentially trapezoidal shape and is formed in such a way that its inclined flanks 312 and 313 have an obtuse angle of inclination β with respect to the plane of substrate 300.

This type of pattern 311 can be obtained in particular by using a resin of the <<Deep UV>> type such as an M78y resin spread over a thickness of approximately 500 nm then lithographed.

A fraction of the resin is irradiated (for example by UV radiation) through a mask comprising a part transparent to short wavelength UV radiation (typically between 150 and 300 nm) and a part opaque to UV radiation (absorbing UV radiation); there is then created, by photochemical reaction, a latent image in the thickness of the photosensitive resin.

The resin is then <<developed>> by using <<developers>> such as TMAH for example (TetraMethylAmmonium Hydroxide). Final baking (<<post bake>> or <<hard bake>>) is applied to harden the resin patterns thus formed. After these development and baking steps, a temperature between 20° C. and 40° C. above the vitreous transition temperature Tg is applied in order to cause the resin to <<creep>>. The temperature creep parameters and the creep duration permit desired angle β to be regulated.

Purely by way of illustrative example, by using a DUV resin called M78y, of thickness 570 nm, an angle α of approx. 53° is obtained for the following conditions: Creep temperature=165° C. (Tg of the resin=145° C.), creep duration=15 minutes, energy=30 mJ/cm². An ebeam type resin could also be used.

Figure 5D:
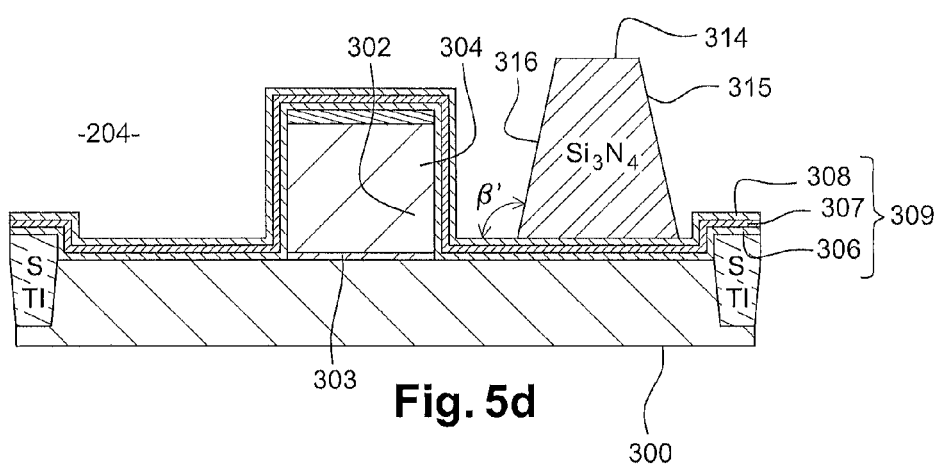

According to a third step 204 illustrated in FIG. 5d, the shape of resin pattern 311 is transferred into sacrificial layer 310.

This transfer is achieved by carrying out plasma etching (dry etching) such as selective reactive ion etching RIE (<<Reactive-Ion Etching>>) of the layer of sacrificial material 310 with stoppage on ONO stack 309. During RIE etching, not only sacrificial material 310 (here $Si_3N_4$) is attacked, but also resin pattern 311. By adopting an etching rate of the resin essentially identical to the etching rate of the sacrificial material, it will be understood that the shape of the resin will be transferred into the sacrificial material in such a way that a pattern 314 is found in the sacrificial material ($Si_3N_4$) of identical shape to that of resin pattern 311 on ONO stack 309 in the zone in which inclined second lateral face 116 is produced. This pattern 314 in the sacrificial material ($Si_3N_4$) thus has an essentially trapezoidal shape and is formed in such a way that its inclined flanks 315 and 316 have an obtuse angle of inclination β' with respect to the plane of substrate 300 essentially equal to (180°-α) where α is the desired acute angle of inclination of second lateral face 116.

If use is made of a <<standard>> nitride etching process in microelectronics, for example an etching machine called Centura AP™, we have an etching rate of $Si_3N_4$ of the order of 1100 Å/min, and an etching rate of resin M78y of the order of 620 Å/min, i.e. an etching selectivity factor between nitride and resin of approx. 1.8, which means that, in these etching conditions, the nitride is etched 1.8 times quicker than resin M78y. Consequently, angle β' will be such that: tgβ'=1.8*tgβ.

If these etching conditions are used, angle β is thus adjusted as a function of desired angle β'.

Generally, we have: tgβ'=(etching rate of sacrificial material/etching rate of selected resin)*tgβ. Nitride has been described as a sacrificial material, but it is understood that other materials having characteristics of good stoppage to mechanical-chemical polishing and selective stripping with respect to polycrystalline silicon can also be used.

The conformal deposition of polysilicon 317 is then carried out, for example, by low pressure chemical vapour deposition LPCVD.

Figure 5E:
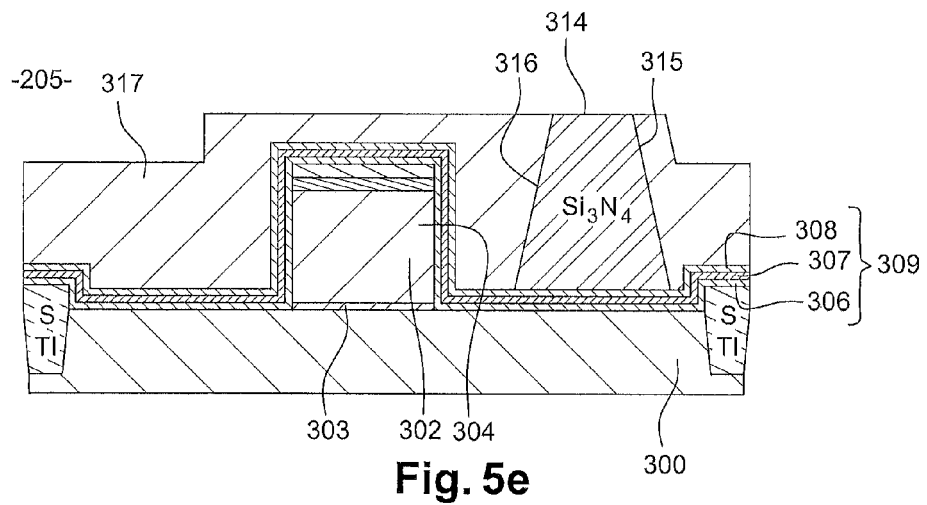

Following this polysilicon filling, according to a step 205 illustrated in FIG. 5e, a planarising step is carried out by mechanical-chemical polishing, also referred to as CMP (<<Chemical Mechanical Polishing>>), of polysilicon layer 317 with stoppage on the upper surface of pattern 314 of $Si_3N_4$.

Figure 5F:
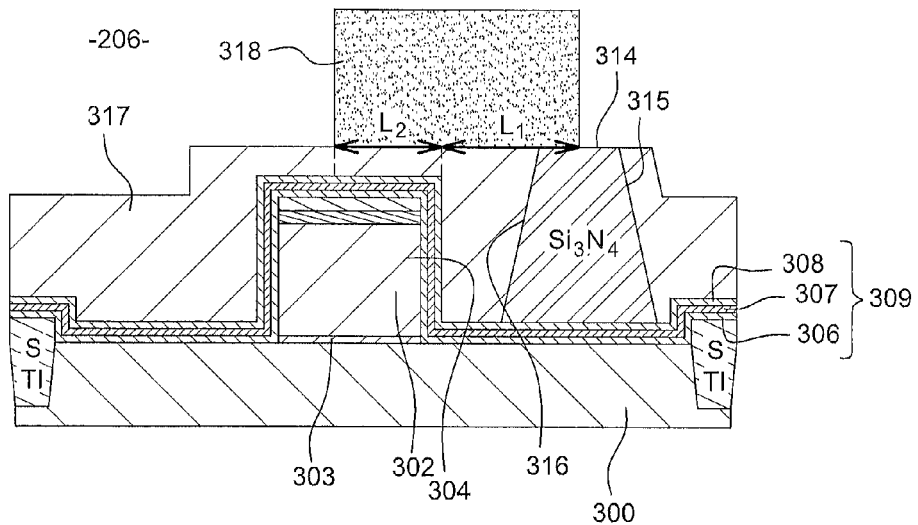

According to a step 206 illustrated in FIG. 5f, a resin pattern 318 is produced. The geometry of this pattern 318 is selected in such a way as to protect the part of polysilicon layer 317 intended to form conductive zone 112 of the memory transistor gate. In the case of FIG. 5f, the pattern is positioned over a length L1+L2 in such a way as to obtain a conductive zone such as that shown on memory cell, 400 of FIG. 4. A resin pattern 318 positioned solely over length L1 would permit a polysilicon conductive zone to be obtained such as that shown on memory cell 100 of FIG. 3.

This type of pattern 318 can be obtained by using an M78y resin (<<deep UV>> resin) of thickness 570 nm or of type NEB22 (ebeam type resin, for example) spread over a thickness of approx. 200 nm for example, then lithographed.

Figure 5G:
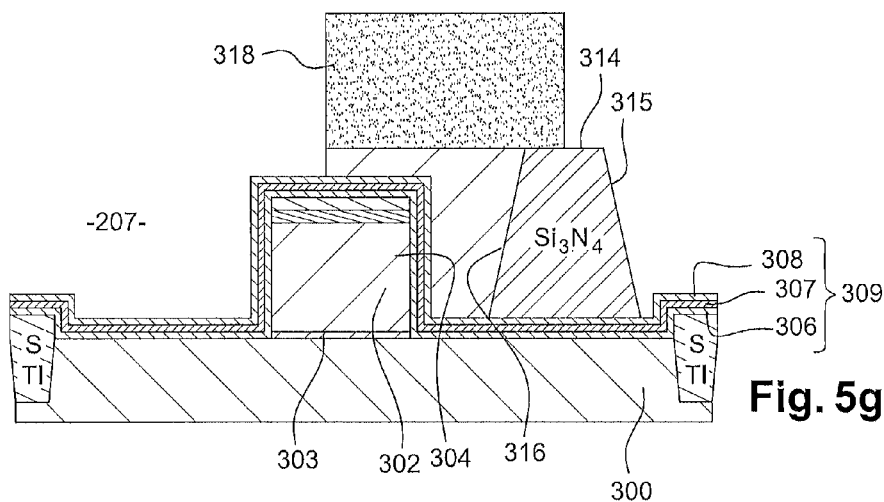

According to a step 207 illustrated in FIG. 5g, a step is carried out for selective stripping, for example by plasma etching (dry etching) such as reactive ion etching RIE, of the polysilicon not protected by resin pattern 318. This etching is carried out with a stoppage on ONO stack 309.

Figure 5H:
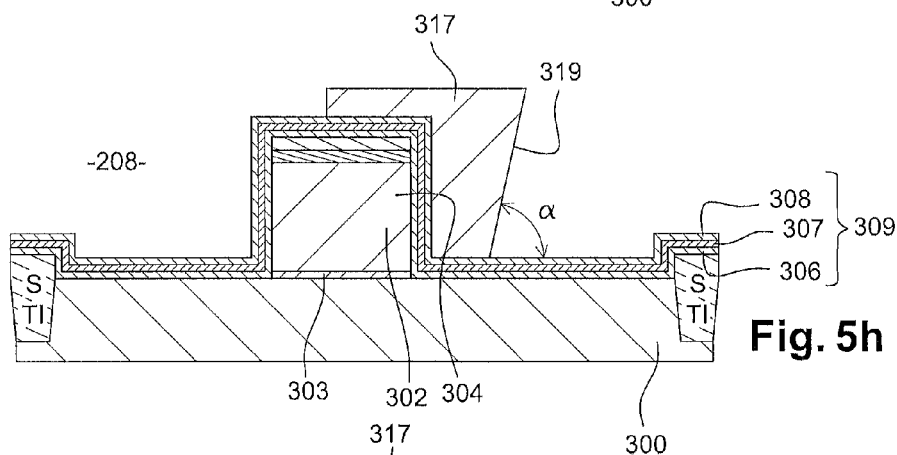

According to step 208, illustrated in FIG. 5h, a step is carried out for stripping resin 318 (stripping step), then pattern 314 of sacrificial material (or vice versa). This stripping is carried out selectively with respect to $SiO_2$ layer 308 of ONO stack 309 and with respect to polycrystalline silicon 319 of the memory transistor gate. This stripping is carried out for example by using etching of the RIE type. It is found here that polysilicon layer 317 has a lateral face 319 inclined at an angle α strictly between 0 and 90° with respect to the plane of substrate 300. This lateral face 319 forms second lateral face 116 (see FIGS. 3 and 4) of the conductive zone of the memory transistor gate of the cell according to the invention. It will be understood that it is beneficial to have an angle α which is greater than or equal to 45° so as to be able to effectively strip the whole of sacrificial layer 314; if angle α is too acute, the step of stripping the totality of the sacrificial material can be made more difficult.

Figure 5I:
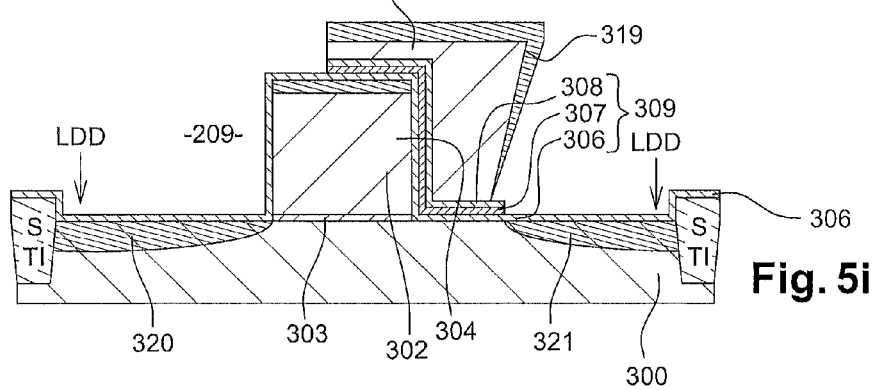

According to step 209 illustrated in FIG. 5i, the stripping of two first layers 308 and 307 of non-covered stack 309 with stoppage on layer 306 is carried out. In the case of a stack 309 of the ONO type, this stripping can be carried out by plasma anisotropic etching (dry etching) such as reactive ion etching RIE with stoppage on $SiO_2$ layer 306. Step 209 then includes an implantation step in such a way as to start the doping of the source and drain extension zones. This doping is doping of type LDD (<<Low Doped Drain>>) making it possible to dope source extension region 321 and drain extension region 320 with an average dose. Depending on whether the transistor that it is desired to produce is of the PMOS or NMOS type, the ions are selected so as to produce zones having a conductivity type p or n. It will be noted that the LDD implantation is made through a part of layer 306 which protects the surface of the semiconductor zone of substrate 300 to be doped.

According to step 210 illustrated in FIG. 5j, the stripping of lower layer 306 of ONO stack 309 is carried out. This stripping is carried out for example by isotropic wet etching with a partially diluted solution of hydrofluoric acid (HF) in such a way as to have a good selectivity of the stripping of SiO2 with respect to substrate 300 (silicon substrate here).

According to step 211 illustrated in FIG. 5k, the various insulating spacers of memory cells 100 or 400 are produced, namely:
  second lateral spacer 121 extending over the entire lateral flank (drain side);
  insulating spacer 129 extending over the entire lateral flank (source side);
  insulating spacer 132 extending over the entire lateral flank (on the memory transistor gate side).

Each of these spacers is formed by a dielectric material, which can for example be an oxide/nitride bi-layer (for example, a layer of $SiO_2$ HTO and a layer of $Si_3N_4$).

To do this, a first so-called HTO oxide layer is initially deposited, obtained for example by LPCVD deposition. Typically, a thickness of 10 nm is deposited. In any event, this thickness must be sufficient to fill the voids resulting from the isotropic etching of the oxide layers of the ONO layer stack that has taken place previously. This layer permits good attachment of the layer of $Si_3N_4$ subsequently deposited, and also performs the role of a stop layer to the etching of the $Si_3N_4$.

The deposition of another layer is then carried out, for example a layer of silicon nitride ($Si_3N_4$). This deposition can be carried out by the same technique as above, i.e. by low pressure chemical vapour deposition LPCVD. A layer of silicon nitride is deposited, which is typically in a thickness range from 20 nm to 40 nm. This layer of silicon nitride makes it possible to form <<nitride spacers>> whose role is to <<space apart>> the implantation zones corresponding to the source/drain (because the latter could become joined during the post-baking which follows the implantation).

These spacers are obtained by etching of the RIE type. The layers of insulating material previously deposited are etched anisotropically in such a way as to retain the vertical parts of these layers of insulating material and to eliminate the horizontal parts of these layers. The etching must be sufficient to disengage the upper part of the layers surmounting polysilicon zones 320, 321, 322 and 323, zones 320 and 321 being used respectively for contact-making for the drain and for the source, zones 322 and 323 respectively being used for contacting on the memory transistor gate (zone 322) and on the selection transistor gate (zone 323); these zones can be silicided to ensure good electrical contact.

Still in the same FIG. 5k, after production of spacers 121, 129 and 132, the doping of source extension region 321 and drain extension region 320 is carried out at higher energy approximately in the alignment of the spacers; this implantation is added to the implantation at the lower energy LDD (Low Doped Drain) which is carried out in alignment with the gates. This doping is carried out by ion implantation of source extension region 321 and drain extension region 320. Thus, in the case of the production of an n-MOS transistor on a substrate 300 of type p, source extension region 321 and drain extension region 320 are doped n+. In order to activate the doping atoms and to rectify the defects due to the bombardment, an implantation post-bake is then carried out (also called activation post-bake).

According to step 212 illustrated in FIG. 5l, a silicidation step is carried out which corresponds to the metallisation of the upper surface of polysilicon layers 322 and 323 by chemical reaction between the silicon and a metal (for example nickel) in such a way as to form a low resistivity zone.

In order to minimise the resistance of drain extension region 320 and source extension region 321 produced in doped monocrystalline silicon, a step of silicidation of these zones is also carried out; the silicidation corresponds to the metallisation of these drain and source zones by chemical reaction between the silicon and a metal (for example nickel) in such a way as to form low resistivity zones. The structure illustrated in FIG. 5*l* is identical to memory cell 400 illustrated in FIG. 4.

It will be appreciated that the invention is not limited to the embodiments described by reference to the figures and variants can be envisaged without departing from the scope of the invention.

In particular, an aspect of the invention has been described more specifically in the case of an ONO type stack; the invention also applies to any type of memory with a discrete trapping layer on split-gate architecture, the electrons being able to be stored in a nitride layer (ONO) but also in a layer of nanocrystals.

Similarly, the embodiments described relate to dielectric gate layers of type $SiO_2$ or $SiO_2$ HTO, but it is understood that other types of dielectrics can be used, for example dielectrics of type <<high-k>> such as $Al_2O_3$ in contact with the conductive region of the memory gate. High-k material or dielectric material with a high dielectric constant is understood to mean a material having a dielectric constant k strictly greater than 3.9 (dielectric constant of silicon dioxide).

Especially in the case of the use of a high-k dielectric material, it is also possible to replace the polysilicon conductive material of the gate conductive zones by metallic materials in order to reduce the work of function matching.

The invention claimed is:

1. An electronic memory cell comprising:
   a substrate on which there is formed an active channel zone produced in a semiconductor material and comprising a channel disposed between a drain extension region and a source extension region;
   a first gate structure surmounting a first part of said channel;
   a lateral spacer disposed against at least one lateral flank of said first gate structure, said lateral spacer comprising a second gate structure surmounting a second part of said channel, said second gate structure comprising:
      a stack of layers, wherein one of said layers is arranged to store electrical charges, said stack including a first stack zone in contact with said second part of said channel and a second stack zone in contact with said lateral flank of said first gate structure;
      a conductive zone of the second gate structure including
         a first lateral face in contact with said second stack zone in such a way that the latter separates said lateral flank of the first gate structure and said first lateral face;
         a lower face essentially plane and parallel to the plane of the substrate, said lower face being in contact with said first stack zone in such a way that said first stack zone separates said second part of said channel and said lower face;
         an upper face essentially plane and parallel to the plane of the substrate;
         a second lateral face, said first and second lateral faces connecting said lower face to said upper face, said second lateral face being inclined at an angle $\alpha$ strictly between 0 and 90° with respect to the plane of the substrate, in such a way that the length of said upper face is strictly greater than the length of said lower face, said lengths being measured as the distance between said first and second lateral faces over the length of said channel.

2. The memory cell according to claim 1, wherein angle $\alpha$ is greater than or equal to 45°.

3. The memory cell according to claim 1, wherein angle $\alpha$ is between 45° and 70°.

4. The memory cell according to claim 1, wherein the layer arranged to store electrical charges of said stack is disposed between two layers of dielectric material of said stack.

5. The memory cell according to claim 1, wherein said layer arranged to store electrical charges is a nitride layer or a layer containing nanocrystals such as silicon nanocrystals.

6. An electronic memory cell comprising:
   a substrate on which there is formed an active channel zone produced in a semiconductor material and comprising a channel disposed between a drain extension region and a source extension region;
   a selection transistor gate surmounting a first part of said channel;
   a lateral spacer disposed against a lateral flank of said selection transistor gate, said lateral spacer comprising a memory transistor gate surmounting a second part of said channel, said memory transistor gate comprising:
      a stack of layers, wherein one of said layers is arranged to store electrical charges, said stack including a first stack zone in contact with said second part of said channel and a second stack zone in contact with said lateral flank of said selection transistor gate;
      a conductive zone of the memory transistor gate including
         a first lateral face in contact with said second stack zone in such a way that the latter separates said lateral flank of the memory transistor gate and said first lateral face;
         a lower face essentially plane and parallel to the plane of the substrate, said lower face being in contact with said first stack zone in such a way that said first stack zone separates said second part of said channel and said lower face;
         an upper face essentially plane and parallel to the plane of the substrate;
         a second lateral face, said first and second lateral faces connecting said lower face to said upper face, said second lateral face being inclined at an angle $\alpha$ strictly between 0 and 90° with respect to the plane of the substrate, in such a way that the length of said upper face is strictly greater than the length of said lower face, said lengths being measured as the distance between said first and second lateral faces over the length of said channel.

7. The memory cell according to claim 6, wherein angle $\alpha$ is greater than or equal to 45°.

8. The memory cell according to claim 6, wherein angle $\alpha$ is between 45° and 70°.

9. The memory cell according to claim 6, wherein the layer arranged to store electrical charges of said stack is disposed between two layers of dielectric material of said stack.

10. The memory cell according to claim 6, wherein said layer arranged to store electrical charges is a nitride layer or a layer containing nanocrystals such as silicon nanocrystals.

* * * * *

UNITED STATES PATENT AND TRADEMARK OFFICE
CERTIFICATE OF CORRECTION

PATENT NO. : 8,836,014 B2
APPLICATION NO. : 13/852504
DATED : September 16, 2014
INVENTOR(S) : Christelle Charpin-Nicolle Page 1 of 1

It is certified that error appears in the above-identified patent and that said Letters Patent is hereby corrected as shown below:

On title page, Item (71) Applicant
Please correct the Applicant to read as follows:

Applicant:
--Commissariat a l'energie atomique et aux energies alternatives, Paris (FR)--

Signed and Sealed this
Thirtieth Day of June, 2015

Michelle K. Lee
*Director of the United States Patent and Trademark Office*